(12) United States Patent
Lu et al.

(10) Patent No.: US 11,735,258 B2
(45) Date of Patent: *Aug. 22, 2023

(54) INCREASE OF A SENSE CURRENT IN MEMORY

(71) Applicant: Micron Technology, Inc., Boise, ID (US)

(72) Inventors: Zhongyuan Lu, Boise, ID (US); Robert J. Gleixner, San Jose, CA (US); Karthik Sarpatwari, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/711,211

(22) Filed: Apr. 1, 2022

(65) Prior Publication Data
US 2022/0223203 A1 Jul. 14, 2022

Related U.S. Application Data

(63) Continuation of application No. 17/004,259, filed on Aug. 27, 2020, now Pat. No. 11,295,811.

(51) Int. Cl.
*G11C 11/00* (2006.01)
*G11C 13/00* (2006.01)

(52) U.S. Cl.
CPC ........ *G11C 13/004* (2013.01); *G11C 13/0004* (2013.01); *G11C 2013/0045* (2013.01)

(58) Field of Classification Search
CPC .............. G11C 13/004; G11C 13/0004; G11C 2013/0045

USPC ........................................................ 365/163
See application file for complete search history.

(56) References Cited

U.S. PATENT DOCUMENTS

| 6,501,697 | B1* | 12/2002 | Perner ................. G11C 11/1673 365/158 |
| 10,453,532 | B1* | 10/2019 | Antonyan .............. G11C 16/10 |
| 2006/0050548 | A1 | 3/2006 | Oh |
| 2010/0097845 | A1 | 4/2010 | Sakimura et al. |
| 2011/0013467 | A1 | 1/2011 | Moore |

(Continued)

OTHER PUBLICATIONS

U.S. Appl. No. 16/729,731, entitled, "Three-State Programming of Memory Cells", filed Dec. 30, 2019, 35 pages.

(Continued)

*Primary Examiner* — Vu A Le
(74) *Attorney, Agent, or Firm* — Brooks, Cameron & Huebsch, PLLC

(57) ABSTRACT

The present disclosure includes apparatuses, methods, and systems for increase of a sense current in memory. An embodiment includes a memory having a plurality of memory cells, and circuitry configured to apply, prior to sensing a data state of a memory cell of the plurality of memory cells, a voltage to an access line to which the memory cell is coupled, determine whether an amount of current on the access line in response to the applied voltage meets or exceeds a threshold amount of current, and determine whether to increase a magnitude of a current used to sense the data state of the memory cell based on whether the amount of current on the access line in response to the applied voltage meets or exceeds the threshold amount of current.

20 Claims, 6 Drawing Sheets

(56) References Cited

U.S. PATENT DOCUMENTS

| | | |
|---|---|---|
| 2012/0099358 A1 | 4/2012 | Sunaga et al. |
| 2012/0206974 A1 | 8/2012 | Moschiano et al. |
| 2016/0125937 A1 | 5/2016 | Kang |
| 2018/0040370 A1 | 2/2018 | Tortorelli et al. |
| 2019/0198098 A1 | 6/2019 | Yang |

OTHER PUBLICATIONS

U.S. Appl. No. 16/729,787, entitled, "Multi-State Programming of Memory Cells", filed Dec. 30, 2019, 48 pages.
International Search Report and Written Opinion from related International Patent Application No. PCT/US2021/046815, dated Nov. 29, 2021, 10 pages.

* cited by examiner

INCREASE OF A SENSE CURRENT IN MEMORY

PRIORITY INFORMATION

This application is a Continuation of U.S. application Ser. No. 17/004,259 filed on Aug. 27, 2020, which will issue as U.S. Pat. No. 11,295,811 on Apr. 5, 2022, the contents of which are incorporated herein by reference.

TECHNICAL FIELD

The present disclosure relates generally to semiconductor memory and methods, and more particularly, to increase of a sense current in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

DETAILED DESCRIPTION

Figure 1:
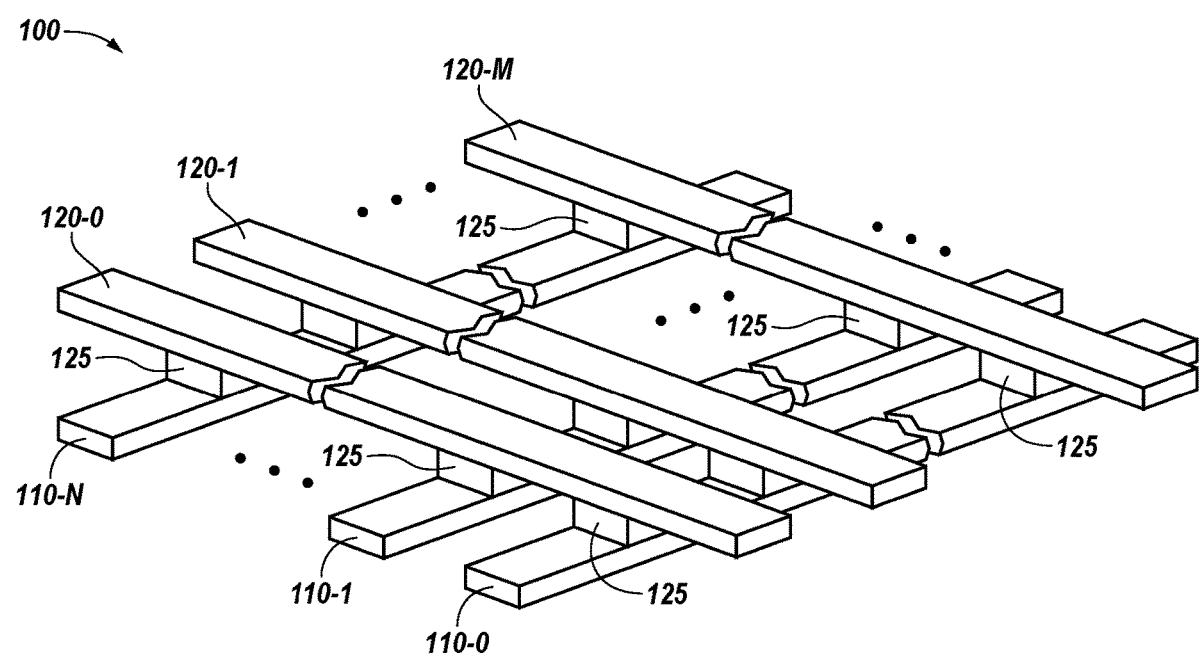
FIG. 1 is a three-dimensional view of an example of a memory array, in accordance with an embodiment of the present disclosure.

The present disclosure includes apparatuses, methods, and systems for increase of a sense current in memory. An embodiment includes a memory having a plurality of memory cells, and circuitry configured to apply, prior to sensing a data state of a memory cell of the plurality of memory cells, a voltage to an access line to which the memory cell is coupled, determine whether an amount of current on the access line in response to the applied voltage meets or exceeds a threshold amount of current, and determine whether to increase a magnitude of a current used to sense the data state of the memory cell based on whether the amount of current on the access line in response to the applied voltage meets or exceeds the threshold amount of current.

During the sensing of a resistance variable memory cell, such as a self-selecting memory cell, a voltage may be applied to the memory cell, and the data state of the cell can be determined based on the amount of current that flows through the cell in response to the applied voltage. For example, when the voltage is applied to the memory cell, the resulting amount of current that is on a signal line (e.g., bit line or word line) to which the memory cell is coupled can be compared to a reference current, and the state of the memory cell can be determined based on the comparison. For instance, the cell can be determined to be in a first (e.g., reset) data state if the comparison indicates the signal line current is less than the reference current, and the cell can be determined to be in a second (e.g., set) data state if the comparison indicates the signal line current is greater than the reference current.

During such a sense operation, however, other (e.g., unselected) memory cells that are coupled to the same signal line as the memory cell that is being sensed may leak additional current on the signal line. This leakage current may result from, for instance, degradation and/or wear on the memory cells that occurs as the cells are continuously programmed throughout the operation of the memory. This leakage current may cause the memory cell that is being sensed (e.g., the selected cell) to be determined to be in a different data state than the state to which the cell is actually programmed. For instance, this leakage current may cause a selected memory cell that is programmed to the first data state to be erroneously determined to be in the second data state, because the addition of the leakage current to the current that flows through selected cell could increase the total amount of current on the signal line to be greater than the reference current. Such erroneous data sensing can reduce the performance and/or lifetime of the memory, and may be more severe in memory having an increased memory cell density.

Embodiments of the present disclosure, however, can compensate for this leakage current by increasing (e.g., dynamically increasing) the reference current to a magnitude that can be used to accurately distinguish between the two data states. For example, embodiments of the present disclosure can determine, prior to sensing the data state of a memory cell (e.g., as part of a pre-read operation), whether an increase of the reference current may be needed due to such leakage current, and increase (or not increase) the magnitude of the reference current used in the subsequent sense operation accordingly. For instance, if the pre-read operation indicates that an increase in the reference current is needed, the magnitude of the reference current may be increased for the subsequent sense operation in order to compensate for the leakage current, but if the pre-read operation indicates that an increase in the reference current is not needed (e.g., because not enough leakage current is present to cause an erroneous determination of the cell's data state), the magnitude of the reference current may not be increased for the subsequent sense operation (e.g., a lower magnitude reference current can still be used). As such, embodiments of the present disclosure can increase the performance and/or lifetime of the memory as compared with previous approaches (e.g., approaches that utilize a static reference current whose magnitude is not adjusted during operation of the memory), while allowing for increased memory cell density.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

FIG. 1 is a three-dimensional view of an example of a memory array 100 (e.g., a cross-point memory array), in accordance with an embodiment of the present disclosure. Memory array 100 may include a plurality of first signal lines (e.g., first access lines), which may be referred to as word lines 110-0 to 110-N, and a plurality of second signal lines (e.g., second access lines), which may be referred to as bit lines 120-0 to 120-M) that cross each other (e.g., intersect in different planes). For example, each of word lines 110-0 to 110-N may cross bit lines 120-0 to 120-M. A memory cell 125 may be between the bit line and the word line (e.g., at each bit line/word line crossing).

The memory cells 125 may be resistance variable memory cells, for example. The memory cells 125 may include a material programmable to different data states. In some examples, each of memory cells 125 may include a single material, between a top electrode (e.g., top plate) and a bottom electrode (e.g., bottom plate), that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. Chalcogenide materials may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

The architecture of memory array 100 may be referred to as a cross-point architecture in which a memory cell is formed at a topological cross-point between a word line and a bit line as illustrated in FIG. 1. Such a cross-point architecture may offer relatively high-density data storage with lower production costs compared to other memory architectures. For example, the cross-point architecture may have memory cells with a reduced area and, resultantly, an increased memory cell density compared to other architectures.

Embodiments of the present disclosure, however, are not limited to the example memory array architecture illustrated in FIG. 1. For example, embodiments of the present disclosure can include a three-dimensional memory array having a plurality of vertically oriented (e.g., vertical) access lines and a plurality of horizontally oriented (e.g., horizontal) access lines. The vertical access lines can be bit lines arranged in a pillar-like architecture, and the horizontal access lines can be word lines arranged in a plurality of conductive planes or decks separated (e.g., insulated) from each other by a dielectric material. The chalcogenide material of the respective memory cells of such a memory array can be located at the crossing of a respective vertical bit line and horizontal word line.

Further, in some architectures (not shown), a plurality of first access lines may be formed on parallel planes or tiers parallel to a substrate. The plurality of first access lines may be configured to include a plurality of holes to allow a plurality of second access lines formed orthogonally to the planes of first access lines, such that each of the plurality of second access lines penetrates through a vertically aligned set of holes (e.g., the second access lines vertically disposed with respect to the planes of the first access lines and the horizontal substrate). Memory cells including a storage element (e.g., self-selecting memory cells including a chalcogenide material) may be formed at the crossings of first access lines and second access lines (e.g., spaces between the first access lines and the second access lines in the vertically aligned set of holes). In a similar fashion as described above, the memory cells (e.g., self-selecting memory cells including a chalcogenide material) may be operated (e.g., read and/or programmed) by selecting respective access lines and applying voltage or current pulses.

Figure 2A:
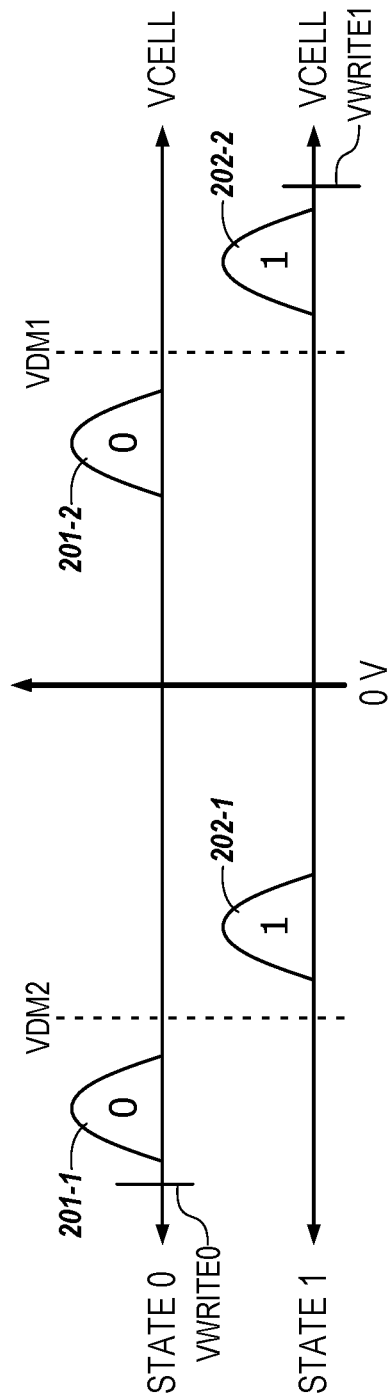
FIG. 2A illustrates threshold voltage distributions associated with various states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of two possible data states (e.g., state 0 or state 1). That is, FIG. 2A illustrates threshold voltage distributions associated with two possible data states to which the memory cells can be programmed.

In FIG. 2A, the voltage VCELL may correspond to a voltage differential applied to (e.g., across) the memory cell, such as the difference between a bit line voltage (VBL) and a word line voltage (VWL) (e.g., VCELL=VBL−VWL). The threshold voltage distributions (e.g., ranges) 201-1, 201-2, 202-1, and 202-2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
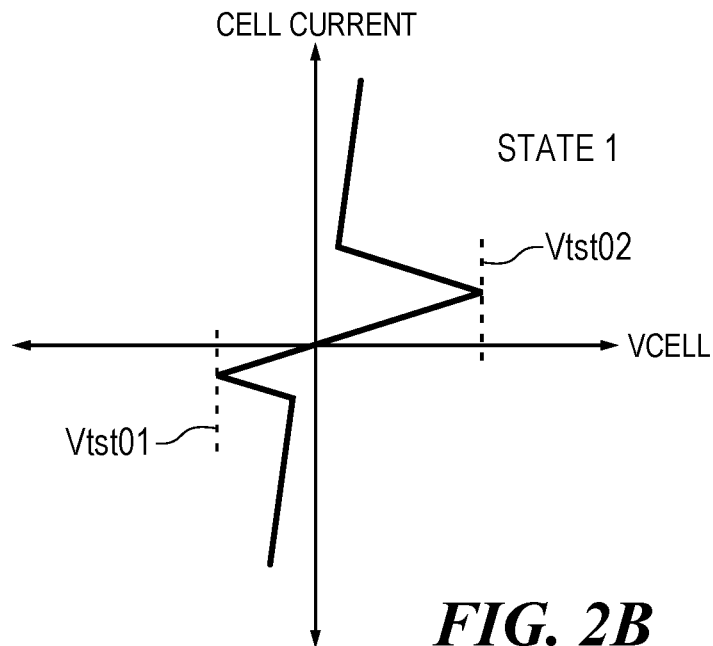
FIG. 2B is an example of a current-versus-voltage curve corresponding to a memory state of FIG. 2A, in accordance with an embodiment of the present disclosure.
Figure 2C:
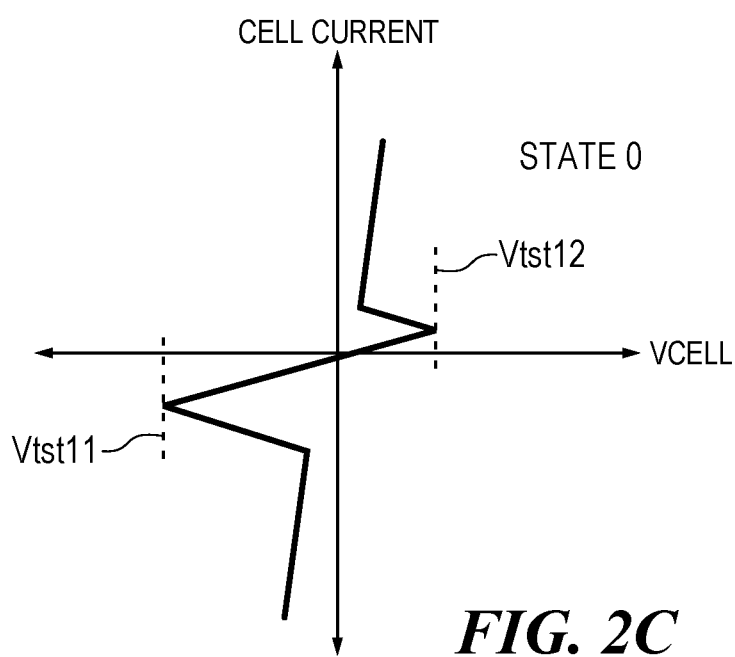
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to a reset state (e.g., state 0) or a set state (e.g., state 1) may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 201-1 and 201-2) whose magnitude is greater for a negative polarity than a positive polarity, and a second data state (e.g., state 1) is associated with a second asymmetric threshold voltage distribution (e.g., threshold voltage distributions 202-1 and 202-2) whose magnitude is greater for a positive polarity than a negative polarity. In such an example, an applied voltage magnitude sufficient to cause a memory cell 125 to snap back can be different (e.g., higher or lower) for one applied voltage polarity than the other.

FIG. 2A illustrates demarcation voltages VDM1 and VDM2, which can be used to determine the state of a memory cell (e.g., to distinguish between states as part of a read operation). In this example, VDM1 is a positive voltage used to distinguish cells in state 0 (e.g., in threshold voltage distribution 201-2) from cells in state 1 (e.g., threshold voltage distribution 202-2). Similarly, VDM2 is a negative voltage used to distinguish cells in state 1 (e.g., threshold voltage distribution 202-1) from cells in state 0 (e.g., threshold voltage distribution 201-1). In the examples of FIGS. 2A-2C, a memory cell 125 in a positive state 1 does not snap back in response to applying VDM1; a memory cell 125 in a positive state 0 snaps back in response to applying VDM1; a memory cell 125 in a negative state 1 snaps back in response to applying VDM2; and a memory cell 125 in a negative state 0 does not snap back in response to applying VDM2.

Embodiments are not limited to the example shown in FIG. 2A. For example, the designations of state 0 and state 1 can be interchanged (e.g., distributions 201-1 and 201-2 can be designated as state 1 and distributions 202-1 and 202-2 can be designated as state 0).

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective word line and bit line). As shown in FIG. 2B, responsive to an applied positive polarity voltage (VCELL), a memory cell programmed to state 1 (e.g., threshold voltage distribution 200-2) is in a nonconductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 1 (e.g., threshold voltage distribution 202-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 201-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 0 (e.g., threshold voltage distribution 201-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 201-2). As such, in a number of embodiments, a snapback event can be used to write a cell to the opposite state (e.g., from state 1 to state 0 and vice versa).

As memory cells 125 are repeatedly programmed (e.g., written) to different data states, the magnitudes of their snapback voltages (e.g., Vtst 01, Vtst 02, Vtst11, and Vtst12) may decrease due to the stress caused by continuously applying the programming voltages to the electrodes of the cells, which in turn may make it easier for the cells to snap back. This reduction in the snapback voltage of a memory cell may cause the cell to leak current during a sense (e.g., read) operation in which the cell is an unselected cell coupled to the same access (e.g., bit) line as the selected cell whose data state is being determined, particularly if the cell is programmed to the set state (e.g., state 1). If this leakage current is not compensated for in a manner as will be further described herein, the selected cell may be sensed to be in a different data state than the state to which the cell was actually programmed. For instance, if this leakage current is not compensated for in a manner as will be further described herein, a memory cell that is programmed to the reset state (e.g., state 0) may erroneously be sensed to be in the set state (e.g., state 1).

Figure 3:
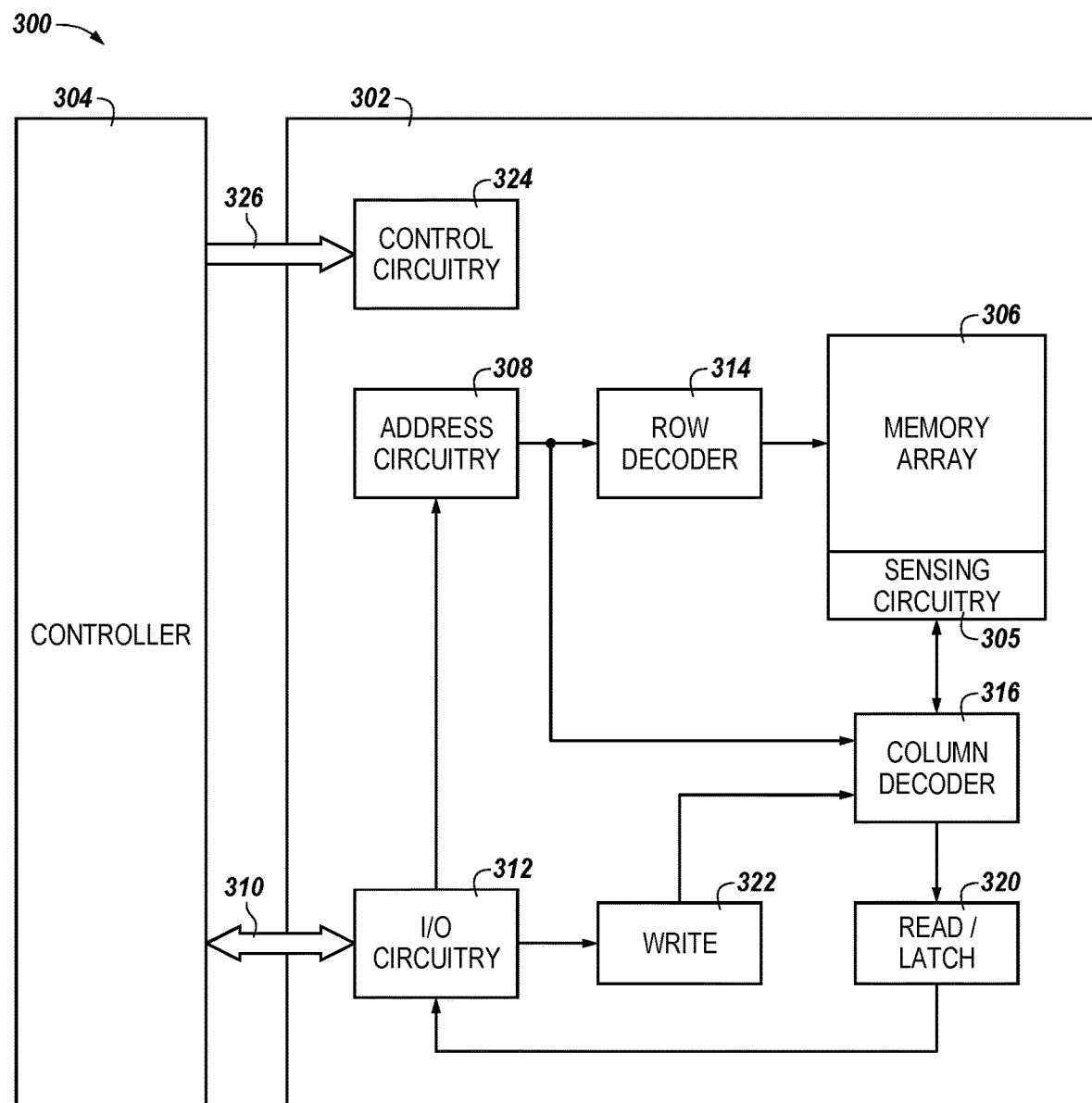
FIG. 3 is a block diagram illustration of an example apparatus, in accordance with an embodiment of the present disclosure.

FIG. 3 is a block diagram illustration of an example apparatus, such as an electronic memory system 300, in accordance with an embodiment of the present disclosure. Memory system 300 may include an apparatus, such as a memory device 302 and a controller 304, such as a memory controller (e.g., a host controller). Controller 304 might include a processor, for example. Controller 304 might be coupled to a host, for example, and may receive command signals (or commands), address signals (or addresses), and data signals (or data) from the host and may output data to the host.

Memory device 302 includes a memory array 306 of memory cells. For example, memory array 306 may include one or more of the memory arrays, such as a cross-point array, of memory cells disclosed herein. Memory device 302 may include address circuitry 308 to latch address signals provided over I/O connections 310 through I/O circuitry 312. Address signals may be received and decoded by a row decoder 314 and a column decoder 316 to access the memory array 306. For example, row decoder 314 and/or column decoder 316 may include drivers.

Memory device 302 may sense (e.g., read) data in memory array 306 by sensing voltage and/or current changes in the memory array columns using sense/buffer circuitry that in some examples may be read/latch circuitry 320. Read/latch circuitry 320 may read and latch data from the memory array 306. Sensing circuitry 305 may include a number of sense amplifiers coupled to memory cells of memory array 306, which may operate in combination with the read/latch circuitry 320 to sense (e.g., read) memory states from targeted memory cells, as will be further described herein. I/O circuitry 312 may be included for bi-directional data communication over the I/O connections 310 with controller 304. Write circuitry 322 may be included to write data to memory array 306.

Control circuitry 324 may decode signals provided by control connections 326 from controller 304. These signals may include chip signals, write enable signals, and address latch signals that are used to control the operations on memory array 306, including data read and data write operations.

Control circuitry 324 may be included in controller 304, for example. Controller 304 may include other circuitry, firmware, software, or the like, whether alone or in combination. Controller 304 may be an external controller (e.g., in a separate die from the memory array 306, whether wholly or in part) or an internal controller (e.g., included in a same die as the memory array 306). For example, an internal controller might be a state machine or a memory sequencer.

In some examples, controller 304 may be configured to increase the magnitude of a current used to sense the data state of the memory cells of memory array 306 when needed to compensate for leakage current from unselected memory cells of the array coupled to the same access line as the memory cell whose state is being sensed, but not increase the magnitude of the current when compensation for such leakage current is not needed. The current can be, for example, a current that is compared to the current on the access line to which the selected memory cell is coupled to determine the state of the selected cell. Such a current may be referred to herein as a "sense current", and its use in sensing the data state of a memory cell will be further described herein (e.g., in connection with FIG. 4).

Controller 304 can determine whether the magnitude of the sense current should be increased (e.g., whether compensation for the leakage current is needed) prior to sensing the data state of the selected memory cell (e.g., as part of a pre-read operation). For example, prior to sensing the data state of the selected memory cell, controller 304 can apply a voltage to the access line (e.g., the bit line or word line) to which the selected memory cell is coupled (e.g., controller 304 can cause the voltage to be applied to the access line). For instance, controller 304 can receive (e.g., from a host) a command to sense the data state of the selected memory cell, and apply the voltage to the access line upon receiving the command.

The magnitude of the voltage applied to the access line can correspond to (e.g. be the same as) the magnitude of a demarcation voltage (e.g., VDM1 and/or VDM2 previously described in connection with FIGS. 2A-2C) used to distinguish memory cells of array 306 in a first data state from memory cells of array 306 in a second data state. Further, while the voltage is being applied to the access line, controller 304 can ground (e.g., cause no voltage to be applied to) the other access line to which the selected memory cell is coupled.

Controller 304 can then determine whether the amount of current on the access line in response to the applied voltage meets or exceeds a threshold amount of current, and determine whether to increase the magnitude of the sense current based on whether the amount of current on the access line in response to the applied voltage meets or exceeds the threshold amount of current. For example, controller 304 can increase the magnitude of the sense current upon determining the amount of current on the access line in response to the applied voltage meets or exceeds the threshold amount of current, but may not increase the magnitude of the sense current upon determining the amount of current on the access line in response to the applied voltage does not meet or exceed the threshold amount of current.

The threshold amount of current can, for example, correspond to (e.g., be the same as) the magnitude of the sense current. In such an example, the manner in which controller 304 determines whether the amount of current on the access line in response to the applied voltage meets or exceeds the threshold can correspond to the manner in which controller 304 will sense the data state of the selected memory cell. For instance, controller 304 can use sensing circuitry 305, which will be further described herein (e.g., in connection with FIG. 4) to compare the magnitude of the sense current to the magnitude of the current that flows on the access line in response to the applied voltage, as will be further described herein. If the comparison indicates that the magnitude of the current on the access line is greater than the magnitude of the sense current, compensation for leakage current may be needed, the magnitude of the sense current can be increased accordingly. If the comparison indicates that the magnitude of the current on the access line is less than the magnitude of the sense current, compensation for leakage current may not be needed, and the magnitude of the sense current may not be increased.

If controller 304 determines an increase of the magnitude of the sense current is needed (e.g., the amount of current on the access line in response to the applied voltage meets or exceeds the threshold amount of current), controller 304 can increase the magnitude of the sense current and sense the data state of the selected memory cell using the sense current after increasing the magnitude of the sense current (e.g., using the increased-magnitude sense current). For instance, the magnitude of the sense current can be increased by 1.25 microAmps (µA). If controller 304 determines an increase of the magnitude of the sense current is not needed (e.g., the amount of current on the access line in response to the applied voltage does not meet or exceed the threshold amount of current), controller 304 can sense the data state of the selected memory cell using the sense current without increasing the magnitude of the sense current.

Figure 4:
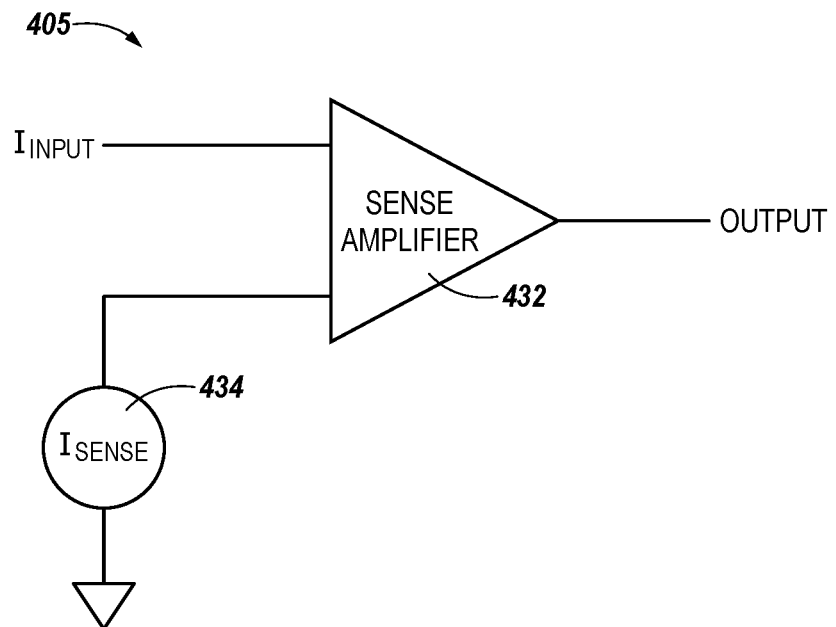
FIG. 4 illustrates example sensing circuitry, in accordance with an embodiment of the present disclosure.

For example, controller 304 can sense the data state of the selected memory cell by applying a demarcation voltage (e.g., VDM1 and/or VDM2 illustrated in FIG. 2A) to the access line to which the cell is coupled, as previously described herein, and using sensing circuitry 305, which will be further described herein (e.g., in connection with FIG. 4). For instance, if the magnitude of the sense current has been increased, the data can be sensed by comparing the increased-magnitude sense current to the magnitude of the current that flows through the selected cell (e.g., on the access line to which the cell is coupled) upon the demarcation voltage being applied to the access line, as will be further described herein. If the magnitude of the sense current has not been increased, the data can be sensed by comparing the non-increased-magnitude sense current to the magnitude of the current that flows through the selected cell upon the demarcation voltage being applied to the access line, as will be further described herein.

As an example, controller 304 can sense the data state of the selected memory cell by applying the demarcation voltage to the access line, and applying an additional voltage to the other access line to which the selected memory cell is coupled while applying the demarcation voltage. For instance, the demarcation voltage can be applied to the access line and the additional voltage can be applied to the other access line for the same amount of time. The magnitude of the demarcation voltage can be equal to the magnitude of the voltage applied to the access line during the pre-read operation to determine whether to increase the magnitude of the sense current, as previously described herein, and can be greater than the magnitude of the additional voltage applied to the other access line. Further, the polarity of the demarcation voltage can be opposite the polarity of the additional voltage. An example of such voltage pulses will be further described herein (e.g., in connection with FIG. 5).

In some examples, controller 304 can increase the magnitude of the sense current that is used to sense the data stored in only the selected memory cell. That is, the magnitude of the sense current may not be increased when being used to sense data stored in other memory cells of array 306, as there may not yet be a need to compensate for leakage current in those cells.

As additional memory cells of array 306 need the magnitude of the sense current used to sense data stored therein to be increased (e.g., to compensate for leakage current as previously described herein), the magnitude of the sense current used to sense the data stored in those cells can also be increased. Once enough cells need the magnitude of the sense current to be increased, the magnitude of the sense current can be automatically increased for the whole array (e.g., without doing the pre-read operation).

For example, prior to sensing the data state of additional memory cells of array 306, controller 304 can apply a voltage to the access line to which each of the additional memory cells are coupled, and then determine whether the amount of current on each respective access line in response to the applied voltage meets or exceeds the threshold amount of current, and whether to increase the magnitude of the sense current for each respective memory cell based on whether the amount of current on the respective access line to which that cell is coupled meets or exceeds the threshold amount of current, in a manner analogous to that previously described herein. Upon the quantity of additional memory cells for which the magnitude of the sense current is increased meeting or exceeding a threshold quantity of cells, controller 304 can increase the magnitude of the sense current used to sense the data stored in all memory cells of array 306.

FIG. 4 illustrates example sensing circuitry 405, in accordance with an embodiment of the present disclosure. Sensing circuitry 405 can be, for instance, sensing circuitry 305 previously described in connection with FIG. 3.

As shown in FIG. 4, sensing circuitry 405 can include a sense amplifier 432. Although a single sense amplifier 432 is illustrated in FIG. 4 for simplicity and so as not to obscure embodiments of the present disclosure, Sensing circuitry 405 (e.g., sensing circuitry 305) can include any number of sense amplifiers analogous to sense amplifier 432.

Sense amplifier 432 can be used to determine the state of a memory cell during a sense operation. For example, during the sense operation, a demarcation voltage (e.g., VDM1 and/or VDM2) can be applied to the memory cell, as previously described herein. In response to the application of the demarcation voltage, a current may flow through the cell and on the signal (e.g., access) line to which the cell is coupled, as previously described herein. The access line can be coupled to sense amplifier 432 to input this current, represented as $I_{INPUT}$ in FIG. 4, into sense amplifier 432, as shown in FIG. 4. In some examples, the magnitude of this current can be multiplied by two before being input into sense amplifier 432.

Sense amplifier 432 can compare the magnitude of $I_{INPUT}$ to the magnitude of sense current (e.g., $I_{SENSE}$) 434 shown in FIG. 4, and the result of the comparison, represented as OUTPUT in FIG. 4, can indicate the data state of the cell. For instance, if the output of sense amplifier 432 (e.g., the result of the comparison) indicates the magnitude of $I_{INPUT}$ is less than $I_{SENSE}$, the memory cell can be determined to be in a first (e.g., reset) data state, and if the output of the sense amplifier 432 indicates the magnitude of $I_{INPUT}$ is greater than $I_{SENSE}$, the memory cell can be determined to be in a second (e.g., set) data state.

During the sense operation, however, the current on the access line to which the memory cell is coupled may also include an additional leakage current from the unselected memory cells coupled to the access line, as previously described herein. The addition of this leakage current could increase the magnitude of $I_{INPUT}$ to be greater than the magnitude of sense current 434, even if the memory cell was programmed to the first (e.g., reset) data state. Accordingly, this leakage current could cause a memory cell that was programmed to the first data state to be erroneously determined to be in the second (e.g., set) data state.

Increasing the magnitude of sense current 434 in accordance with embodiments of the present disclosure, however, can compensate for this leakage current. For instance, if the magnitude of sense current 434 is increased as previously described herein, the magnitude of $I_{INPUT}$ when a memory cell that was programmed to the first data state is being sensed may be less than the magnitude of sense current 434, even with the additional leakage current. Accordingly, the memory cell can be correctly determined to be in the first data state, even with the additional leakage current.

Figure 5:
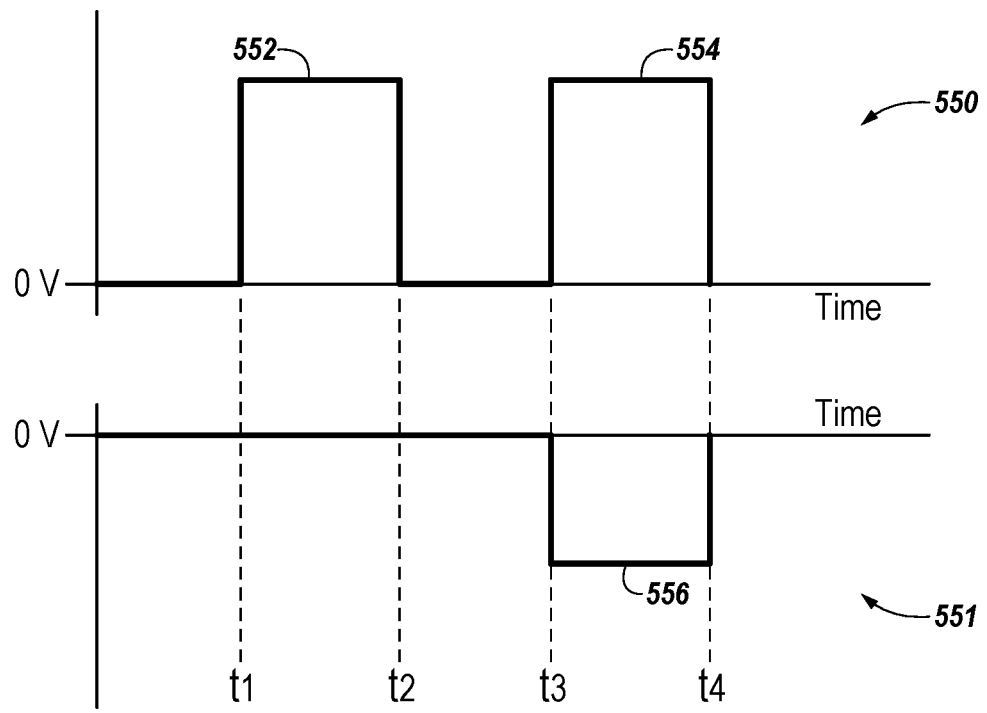
FIG. 5 illustrates an example of voltage pulses applied to a memory cell, in accordance with an embodiment of the present disclosure.

FIG. 5 illustrates an example, in the form of graphs 550 and 551, of voltage pulses applied to a memory cell, in accordance with an embodiment of the present disclosure. For example, graph 550 can illustrate voltage pulses applied to a first access line to which the memory cell is coupled, and graph 551 can illustrate a voltage pulse applied to a second access line to which the memory cell is coupled. In an example, the first access line can be a bit line, and the second access line can be a word line. However, embodiments of the present disclosure are not so limited (e.g., in some examples, the first access line can be a word line and the second access line can be a bit line). The memory cell can be, for example, one of memory cells 125 previously described in connection with FIG. 1.

At time t1 shown in FIG. 5, voltage pulse 552 is applied to the first access line. Voltage pulse 552 can have a positive polarity, as illustrated in FIG. 5, and can have a magnitude equal to the magnitude of a demarcation voltage (e.g., VDM1 and/or VDM2 illustrated in FIG. 2A), as previously described herein. Voltage pulse 552 can be applied to the first access line as part of a pre-read operation to determine whether to increase the magnitude of a current used to determine the state of the memory cell (e.g., the sense current), as previously described herein.

As shown in FIG. 5, voltage pulse 552 (e.g., the pre-read operation) ends at time t2. Further, no voltage is applied to the second access line while voltage pulse 552 is being applied to the first access line (e.g., from time t1 to time t2), as illustrated in FIG. 5.

At time t3 shown in FIG. 5, voltage pulse 554 is applied to the first access line, and voltage pulse 556 is applied to the second access line. Voltage pulse 554 is a positive voltage pulse and voltage pulse 556 is a negative voltage pulse, as illustrated in FIG. 5. As shown in FIG. 5, voltage pulse 554 can have a magnitude equal to voltage pulse 552, and voltage pulse 556 can have lower magnitude than voltage pulse 554. For instance, the magnitude of voltage pulse 556 can be half the magnitude of voltage pulse 554. Further, voltage pulse 554 can have a positive polarity, and voltage pulse 556 can have a negative polarity, as illustrated in FIG. 5.

Voltage pulses 554 and 556 can be applied to the first and second access lines, respectively, during an operation to sense the data state of the memory cell, as previously described herein. For example, voltage pulse 554 can be a demarcation voltage (e.g., VDM1 and/or VDM2 illustrated in FIG. 2A), as previously described herein.

As shown in FIG. 5, voltage pulses 554 and 556 (e.g., the sense operation) end at time t4. For instance, the duration of voltage pulses 554 and 556 can be the same (e.g., from time t3 to time t4).

Figure 6A:
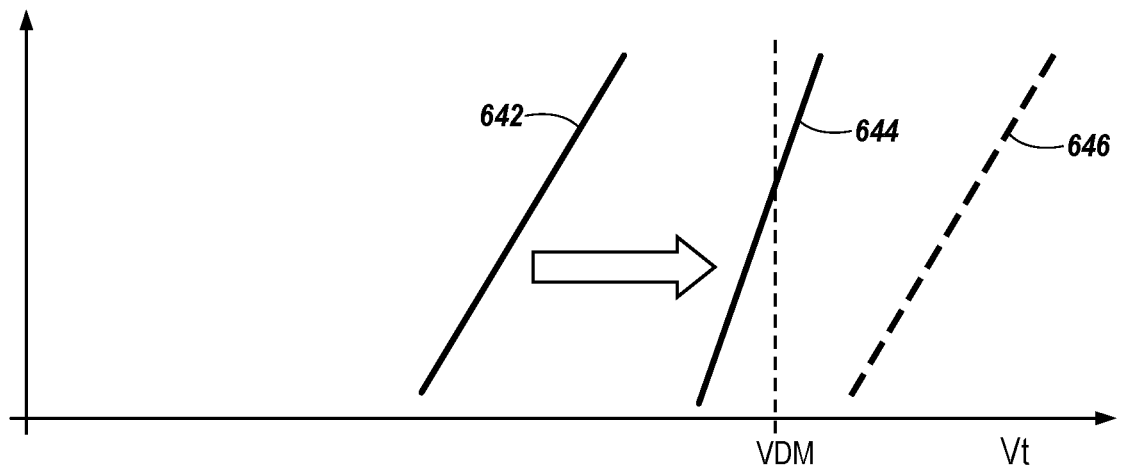
FIGS. 6A-6B illustrate a conceptual example of increasing a sense current to compensate for leakage current in memory, in accordance with an embodiment of the present disclosure.
Figure 6B:
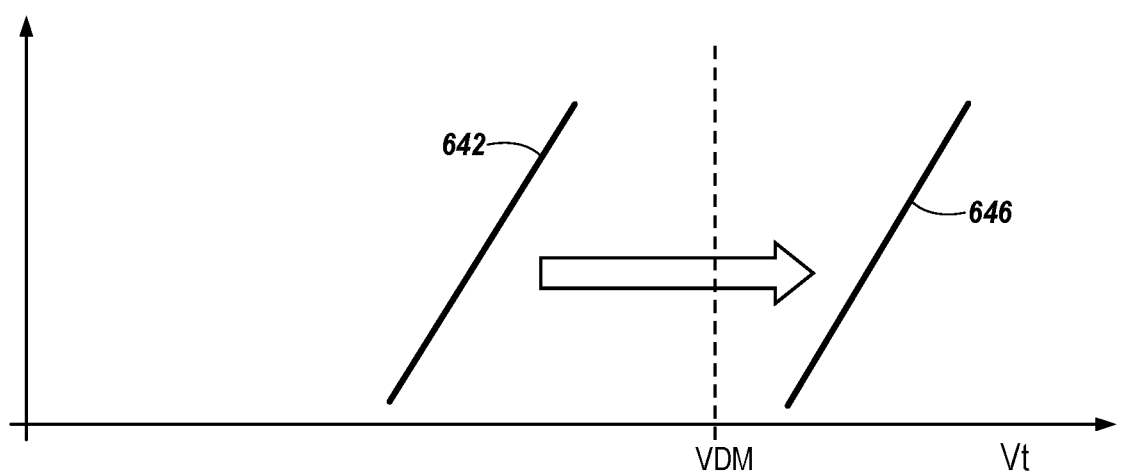

FIGS. 6A-6B illustrate a conceptual example of increasing a sense current (e.g., sense current 434 previously described in connection with FIG. 4) to compensate for leakage current in memory, in accordance with an embodiment of the present disclosure. For instance, FIG. 6A illustrates a conceptual example of threshold voltage distributions associated with a data state (e.g. a reset data state) of memory cells, such as memory cells 125 illustrated in FIG. 1, without increasing the sense current, and FIG. 6B illustrates a conceptual example of threshold voltage distributions associated with the data state of the memory cells after the sense current has been increased in accordance with the present disclosure.

For example, in FIGS. 6A and 6B, threshold voltage distribution 642 represents the threshold voltages to which the memory cells were previously programmed, and threshold voltage distribution 646 represents the present, actual threshold voltages of the memory cells to which the cells have drifted over time. However, in FIG. 6A (e.g., without an increase of the sense current), threshold voltage distribution 644 represents what the threshold voltages of the memory cells would presently appear to be, due to the leakage current, when the cells are sensed using a demarcation voltage (e.g., VDM 1 and/or VDM 2). As illustrated in FIG. 6A, although the threshold voltages of all the memory cells should be sensed to be greater than the demarcation voltage (e.g., should be sensed to be within distribution 646), the threshold voltages of some of the memory cells are sensed to be less than the demarcation voltage (e.g., a portion of distribution 644 is less than the VDM). Accordingly, some of the memory cells (e.g., the cells whose threshold voltages are sensed to be less than the VDM) will erroneously be determined to be in a different data state (e.g., the set data state) than the state to which they were programmed (e.g., reset data state) without an increase of the sense current.

In contrast, as illustrated in FIG. 6B (e.g., after the sense current has been increased), the threshold voltages of all the memory cells are sensed to be greater than the demarcation voltage (e.g., the threshold voltages of the memory cells are sensed to be in distribution 646). Accordingly, all the memory cells will correctly be determined to be in the reset data state.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory having a plurality of memory cells; and
circuitry configured to:
apply a voltage to an access line to which a memory cell of the plurality of memory cells is coupled;
determine whether an amount of current on the access line in response to the applied voltage meets or exceeds a threshold amount of current; and
determine whether to use a current of a first magnitude or of a second magnitude to sense a data state of the memory cell based on whether the amount of current on the access line in response to the applied voltage meets or exceeds the threshold amount of current.

2. The apparatus of claim 1, wherein the second magnitude is greater than the first magnitude.

3. The apparatus of claim 1, wherein the circuitry is configured to sense the data state of the memory cell using the determined current.

4. The apparatus of claim 1, wherein the circuitry is configured to:
determine to use the current of the first magnitude to sense the data state of the memory cell upon determining the amount of current on the access line in response to the applied voltage does not meet or exceed the threshold amount of current; and
determine to use the current of the second magnitude to sense the data state of the memory cell upon determining the amount of current on the access line in response to the applied voltage meets or exceeds the threshold amount of current.

5. The apparatus of claim 1, wherein the circuitry is configured to:
apply the voltage to an access line to which each of a number of additional memory cells of the plurality of memory cells is coupled;
determine whether an amount of current on each respective access line in response to the applied voltage meets or exceeds the threshold amount of current; and
determine whether to use the current of the first magnitude or of the second magnitude to sense a data state of each respective additional memory cell based on whether the amount of current on the respective access line to which that additional memory cell is coupled in response to the applied voltage meets or exceeds the threshold amount of current.

6. The apparatus of claim 5, wherein the circuitry is configured to use the current of the second magnitude to sense a data state of all memory cells of the plurality of memory cells upon determining to use the current of the second magnitude to sense the data state of a quantity of the additional memory cells that meets or exceeds a threshold quantity of memory cells.

7. The apparatus of claim 1, wherein the data state of the memory cell is a data state associated with an asymmetric threshold voltage distribution whose magnitude is greater for a first polarity than a second polarity.

8. The apparatus of claim 1, wherein the circuitry is configured to determine whether to use the current of a first magnitude or of a second magnitude to sense a data state of only the memory cell based on whether the amount of current on the access line in response to the applied voltage meets or exceeds the threshold amount of current.

9. An apparatus, comprising:
a memory having a plurality of memory cells; and
circuitry configured to:
apply a voltage to an access line to which a memory cell of the plurality of memory cells is coupled;
determine whether an amount of current on the access line in response to the applied voltage meets or exceeds a threshold amount of current; and
sense a data state of the memory cell using a current of a first magnitude or of a second magnitude based on whether the amount of current on the access line in response to the applied voltage meets or exceeds the threshold amount of current.

10. The apparatus of claim 9, wherein the circuitry is configured to apply the voltage to the access line upon receiving a command to sense the data state of the memory cell.

11. The apparatus of claim 9, wherein the threshold amount of current corresponds to the first magnitude.

12. The apparatus of claim 9, wherein the memory cell is a self-selecting memory cell.

13. The apparatus of claim 9, wherein the circuitry is configured to sense the data state of the memory cell by comparing the current of the first magnitude or of the second magnitude to a magnitude of a current on the access line in response to applying an additional voltage to the access line.

14. A method of operating memory, comprising:
applying a voltage to an access line to which a memory cell of a memory is coupled;
determining whether an amount of current on the access line in response to the applied voltage meets or exceeds a threshold amount of current; and
sensing a data state of the memory cell using a current of a first magnitude or of a second magnitude that is greater than the first magnitude based on whether the amount of current on the access line in response to the applied voltage meets or exceeds the threshold amount of current.

15. The method of claim 14, wherein the method includes applying the voltage to the access line to which the memory cell is coupled prior to sensing the data state of the memory cell.

16. The method of claim 14, wherein the method includes sensing the data state of the memory cell using the current of the first magnitude upon determining the amount of current on the access line in response to the applied voltage does not meet or exceed the threshold amount of current.

17. The method of claim 14, wherein the method includes sensing the data state of the memory cell using the current of the second magnitude upon determining the amount of current on the access line in response to the applied voltage meets or exceeds the threshold amount of current.

18. The method of claim 14, wherein the method includes:
   receiving a command to sense the data state of the memory cell; and
   applying the voltage to the access line upon receiving the command.

19. The method of claim 14, wherein the method includes grounding an additional access line to which the memory cell is coupled while applying the voltage to the access line.

20. The method of claim 14, wherein sensing the data state of the memory cell includes applying an additional voltage to the access line to which the memory cell is coupled.

\* \* \* \* \*